(12) United States Patent
Baba

(10) Patent No.: US 6,369,443 B1
(45) Date of Patent: Apr. 9, 2002

(54) SEMICONDUCTOR DEVICE WITH STACKED VIAS

(75) Inventor: Shinji Baba, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/481,687

(22) Filed: Jan. 12, 2000

(30) Foreign Application Priority Data

Jul. 21, 1999  (JP) ............................................. 11-206576

(51) Int. Cl.[7] ............................................. H01L 23/053
(52) U.S. Cl. .................... 257/700; 257/697; 257/778
(58) Field of Search .............................. 257/700, 600, 257/701, 697, 778

(56) References Cited

U.S. PATENT DOCUMENTS 5,959,348 A * 9/1999 Chang et al. ............... 257/700

FOREIGN PATENT DOCUMENTS

JP           6-37249      2/1994
JP           9-260537     10/1997

* cited by examiner

Primary Examiner—Roy Potter
(74) Attorney, Agent, or Firm—McDermott, Will & Emery

(57) ABSTRACT

A semiconductor device which ensures high packaging reliability and maintains high power/ground plane characteristics and can be embodied inexpensively even when the device has a large number of terminals, as well as to provide a method of manufacturing the semiconductor device. Since the reliability of mounting of the solder balls 9 can be improved even when the system board 16 is of great size, there can be embodied a BGA-type semiconductor device having terminals in the number of 700 to 1000 pins or more, thus eliminating a necessity for mounting sockets, which would be required in the case of a PGA-type semiconductor device and contributing to a decrease in costs. Further, even when the number of terminal pins is increased further, since the signal terminals can be arranged in a full-matrix pattern with a high degree of freedom, the semiconductor chip 2 can be made compact. The bumps 3 formed between the semiconductor chip 2 and the BGA substrate 1 have high reliability, and hence a multi-pin semiconductor device can be embodied inexpensively.

15 Claims, 6 Drawing Sheets

SEMICONDUCTOR DEVICE WITH STACKED VIAS

BACKGROUND OF THE INVENTION

1. Field of the Invention

The present invention relates to a semiconductor device and a method of manufacturing the semiconductor device, and more particularly, to a semiconductor device comprising a substrate formed from organic material, as well as to a method of manufacturing the semiconductor device.

2. Description of Related Art

FIG. 8 is a cross-sectional view showing a conventional semiconductor layer. In FIG. 8, reference numeral 17 designates a ceramic substrate formed from ceramic material; 2 designates a semiconductor chip connected to the ceramic substrate 17 via bumps 3 by means of flip-chip solder bonding; 4 designates an underfill resin to be used for filling a gap between the semiconductor chip 2 and the ceramic substrate 17; 12 designates a chip capacitor fabricated on the ceramic substrate 17 for reducing switching noise; and 9 designates a solder ball formed on the undersurface of the ceramic substrate 17.

As shown in FIG. 8, in the case of a conventional semiconductor device to be used in an application where special demand exists for high electrical performance, the length of an electrical connection is shortened by interconnecting, for example, a ball-grid array (BGA) substrate (i.e., the ceramic substrate 17) formed from ceramic material and the semiconductor chip 2, via the bumps 3. The coefficient of thermal expansion of the semiconductor device formed from ceramic material differs from that of a system board formed from organic material. In order to ensure packaging reliability, use of a BGA package is limited to solely an area where there is to be fabricated a device having a small outer dimension; i.e., an area where there is to be fabricated a device having a small number of terminals. For this reason, a pin-grid array (PGA) package is employed for an area where there is to be fabricated a device having a large outer dimension; i.e., an area where there is to be fabricated a device having a large number of terminals. Accordingly, sockets to be used for connection of a semiconductor device must be provided on both the semiconductor device and the system board, respectively, thus incurring excessive cost.

FIG. 9 is an electrical model showing the chip capacitor shown in FIG. 8. In FIG. 9, those elements assigned the same reference numerals as those provided in FIG. 8 have the same features, and hence repetition of their explanations is omitted here for brevity. In FIG. 9, reference numeral 13a designates a power supply plane embedded in the ceramic substrate 17, which is multilayered; 13b designates a ground plane embedded in the ceramic substrate 17; and 18 designates inductance of wiring patterns.

In association with an increase in a signal processing rate of an electronic device, switching noise has conventionally presented a problem. As shown in FIG. 9, a conventional semiconductor device employs a multilayered substrate comprising 10 or more layers and achieves high performance by means of building up the power supply plane 13a and the ground plane 13b (hereinafter referred to collectively as "power/ground planes 13"). In order to greatly improve the characteristics of the power/ground planes 13, a chip capacitor 12 of high capacitance is disposed on the ceramic substrate 17 as a noise absorption capacitor for absorbing switching noise.

If the chip capacitor 12 and the semiconductor chip 2 are disposed side-by-side, an interconnection used for connecting the semiconductor chip 2 and the chip capacitor 12 becomes excessively long, thus resulting in an increase in the inductance of a wiring pattern. Thus, even when the low-inductance chip capacitor 12 is employed for realizing high performance by virtue of reduction of switching noise, the chip capacitor 12 cannot make full use of its high performance. Moreover, the chip capacitor 12 itself is expensive.

SUMMARY OF THE INVENTION

The present invention has been conceived to solve the problems involved in the background art, and the object of the present invention is to provide a semiconductor device which ensures high packaging reliability and can be embodied inexpensively even when the device has a large number of terminals, as well as to provide a method of manufacturing the semiconductor device.

Another object of the present invention is to provide a semiconductor device which maintain high power/ground plane characteristics and can be embodied inexpensively even when the device has a large number of terminals, as well as to provide a method of manufacturing the semiconductor device.

According to a first aspect of the present invention, there is provided a semiconductor device comprising: an organic substrate formed from organic material; a package section formed by stacking a plurality of the organic substrates; stacked vias formed by directly joining together connection holes formed in respective the organic substrates stacked in the package section, in the stacking direction of the organic substrates; and a semiconductor chip having bumps bonded to the organic substrate forming the upper surface of the package section and formed at a predetermined pitch, wherein the stacked vias are formed at the same pitch as that at which the bumps are formed on the semiconductor chip.

According to a second aspect of the present invention, there is provided a method of manufacturing a semiconductor device comprising the steps of: forming a package section by stacking a plurality of organic substrates formed from organic material; forming stacked vias by directly joining together connection holes formed in the respective organic substrates stacked in the package section, in the stacking direction of the organic substrates; and bonding a semiconductor chip having bumps formed at a predetermined pitch on the organic substrate forming the upper surface of the package section, wherein the stacked vias are formed at the same pitch as that at which the bumps are formed on the semiconductor chip.

The above and other objects, effects, features and advantages of the present invention will become more apparent from the following description of the embodiments thereof taken in conjunction with the accompanying drawings.

DETAILED DESCRIPTION OF THE PREFERRED EMBODIMENTS

Figure 1:
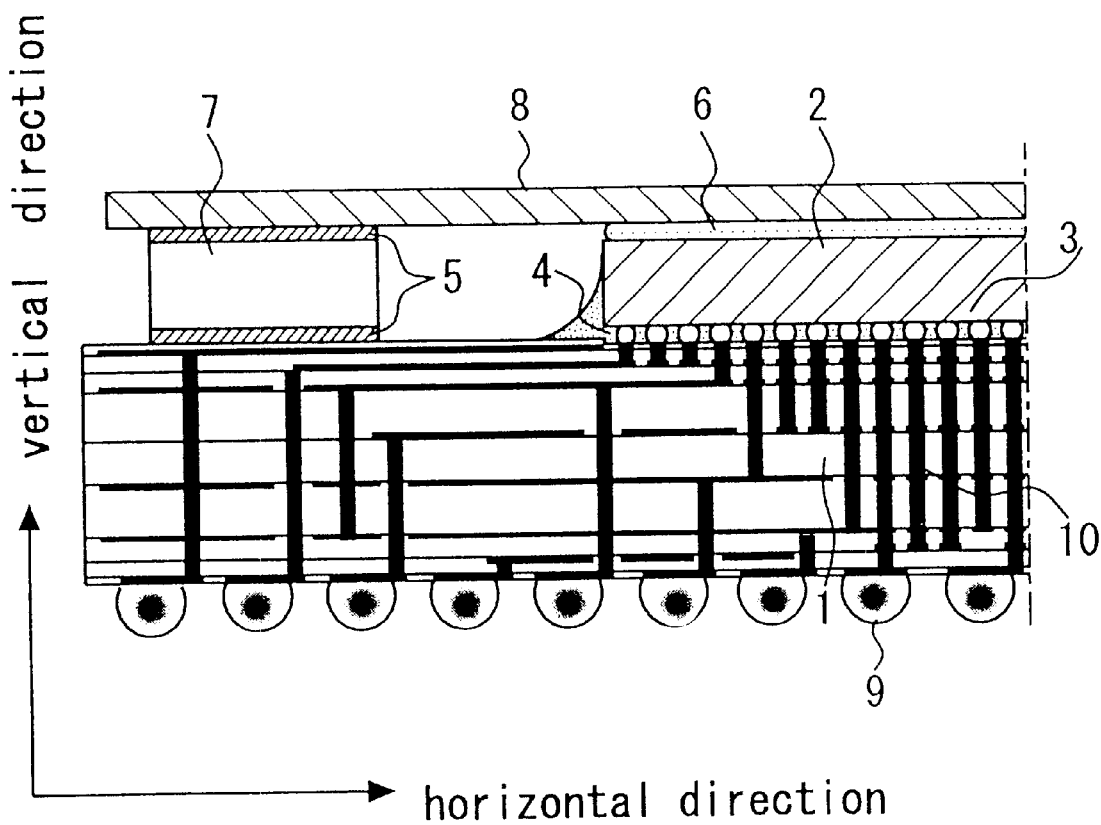
FIG. 1 is a cross-sectional view showing a semiconductor device according to a embodiment 1 of the present invention.

Embodiments of the present invention will be described below with reference to the accompanying drawings. It is noted that the same reference symbols in the drawings denote the same or corresponding components.

Embodiment 1

FIG. 1 is a cross-sectional view showing a semiconductor device according to a embodiment 1 of the present invention. In FIG. 1, reference numeral 1 designates a BGA substrate formed from organic material; 2 designates a semiconductor chip connected to the BGA substrate 1 via bumps 3 by means of flip-chip solder bonding; 4 designates underfill resin used for filling a gap between the semiconductor chip 2 and the BGA substrate 1; 7 designates a ring attached to the upper surface of the BGA substrate 1 by way of a ring adhesive 5; 8 designates a heat spreader which is connected to the upper surface of the semiconductor chip 2 by way of a heat spreader adhesive and is connected to the upper surface of the ring 7 by way of an adhesive identical with the ring adhesive 5; 9 designates a solder ball formed on the undersurface (or rear surface) of the BGA substrate 1; and 10 designates a stacked via.

The BGA substrate 1 is formed from organic material whose coefficient of thermal expansion is equal to that of a system board 16 (which will be described later) formed from commonly-available organic material; for example, FR4 or epoxy resin typified by BT resin. Even when the system board 16 is of large size, the reliability of mounting of the solder balls 9 can be improved. Therefore, a BGA-type semiconductor device having terminals in the number of 500 to 1000 pins or more can be embodied. Consequently, a necessity for mounting sockets, such as those described in connection with the background art, which would be required in the case of a PGA-type semiconductor device, can be eliminated, thus enabling cost reduction.

The BGA substrate 1 shown in the example shown in FIG. 1 has a multilayered structure comprising eight layers. An expression "package section 1" may often be used herein in place of the BGA substrate 1 to designate the entirety of the multilayered structure. As shown in FIG. 1, connection holes formed in the multilayered BGA substrate 1 are vertically joined together in the stacking direction of the BGA substrate 1 (i.e., the vertical direction), thus constituting stacked vias 10. The stacked vias 10 are horizontally arranged at the same pitch as that on which the bumps 3 are horizontally arranged on the semiconductor chip 1.

By means of formation of the stacked vias 10 in the manner as mentioned previously, even when the semiconductor device has terminals in the number of 500 to 1000 pins or more, signal terminals may be arranged in a full-matrix pattern with a high degree of freedom. Accordingly, the semiconductor chip 2 can be made compact, and the bumps 3 interposed between the semiconductor chip 2 and the BGA substrate 1 have high reliability. Thus, a multi-pin semiconductor can be embodied inexpensively.

As mentioned above, according to the embodiment 1, since the reliability of mounting of the solder balls 9 can be improved even when the system board 16 is of great size, there can be embodied a BGA-type semiconductor device having terminals in the number of 500 to 1000 pins or more, thus eliminating a necessity for mounting sockets, which would be required in the case of a PGA-type semiconductor device and contributing to a decrease in costs. Further, even when the number of terminal pins is increased further, since the signal terminals can be arranged in a full-matrix pattern with a high degree of freedom, the semiconductor chip 2 can be made compact. The bumps 3 formed between the semiconductor chip 2 and the BGA substrate 1 have high reliability, and hence a multi-pin semiconductor device can be embodied inexpensively.

Embodiment 2

Figure 2:
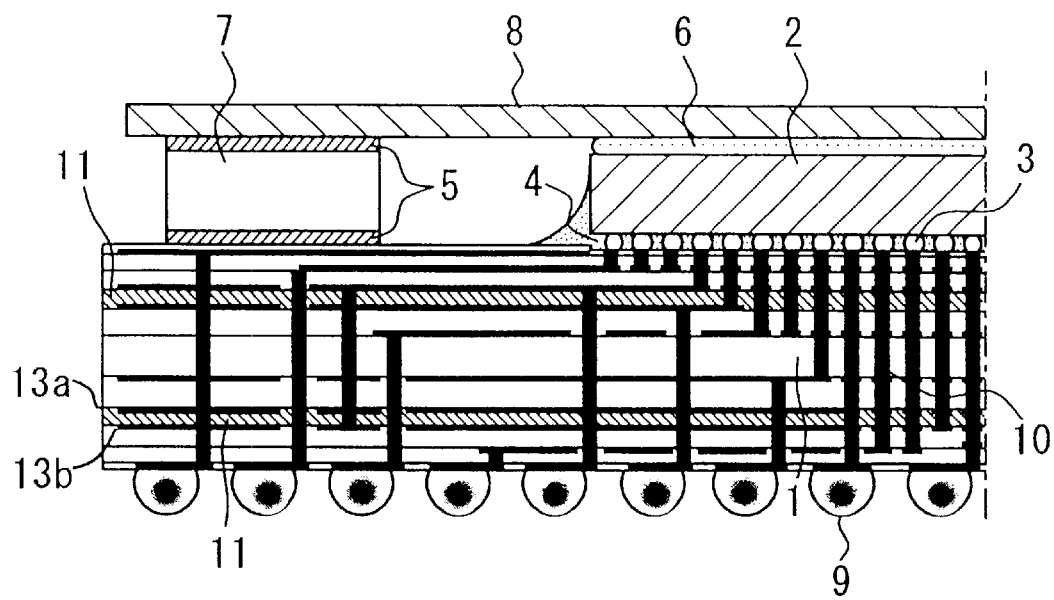
FIG. 2 is a cross-sectional view showing a semiconductor device according to a embodiment 2.

FIG. 2 is a cross-sectional view showing a semiconductor device according to a embodiment 2. In FIG. 2, those elements assigned the same reference numerals as those provided in FIG. 1 have the same features, and hence repetition of their explanations is omitted here for brevity. In FIG. 2, reference numeral 11 designates a high-dielectric layer (or a capacitor layer) formed from high-dielectric material.

As shown in FIG. 2, in addition to having the package section 1 whose structure is described in connection with the embodiment 1, the semiconductor substrate of the embodiment 2 is provided with a high-dielectric layer 11 interposed solely between a power plane 13a and a ground plate 13b, both being embedded in the BGA substrate 1 formed from organic material.

Figure 3:
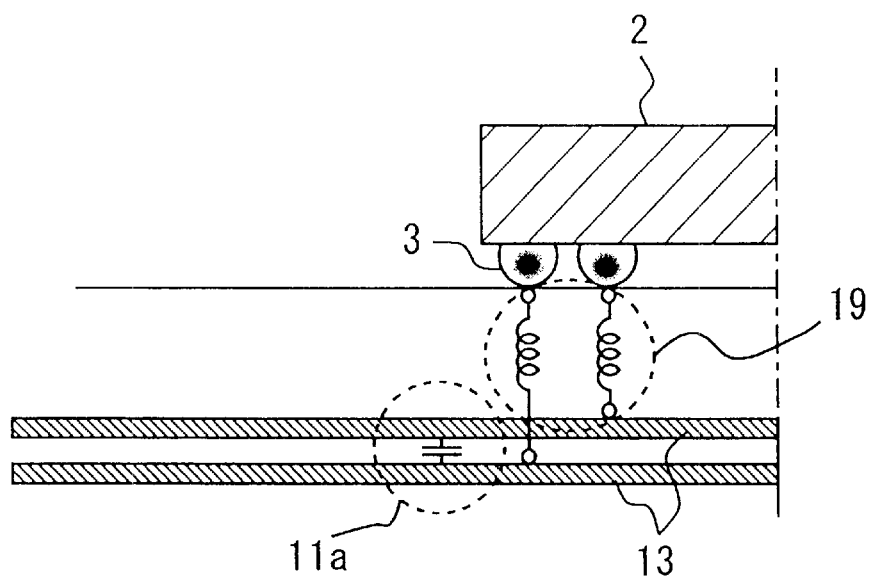
FIG. 3 is a cross-sectional view of the semiconductor device for describing the capability of the high-dielectric layer shown in FIG. 2.

FIG. 3 is a cross-sectional view of the semiconductor device for describing the capability of the high-dielectric layer shown in FIG. 2. In FIG. 3, those elements assigned the same reference numerals as those provided in FIGS. 1 and 2 have the same features, and hence repetition of their explanations is omitted here for brevity. As shown in FIG. 3, inductance 19 existing between the bumps 3 and power/ground planes 13 can be minimized by means of a capacitor that constituted of a high-dielectric layer 11 formed between the power/ground planes 13, thus effectively diminishing switching noise.

As mentioned above, according to the embodiment 2, the high-dielectric layer 11 is provided only between the power supply plane 13a and the ground plane 13b provided within the BGA substrate 1 formed from organic material, and the package section 1 has the structure embodied in the embodiment 1. As a result, the inductance 19 existing between the bumps 3 and the power/ground planes 13 can be minimized, thus effectively diminishing switching noise.

Embodiment 3

Figure 4:
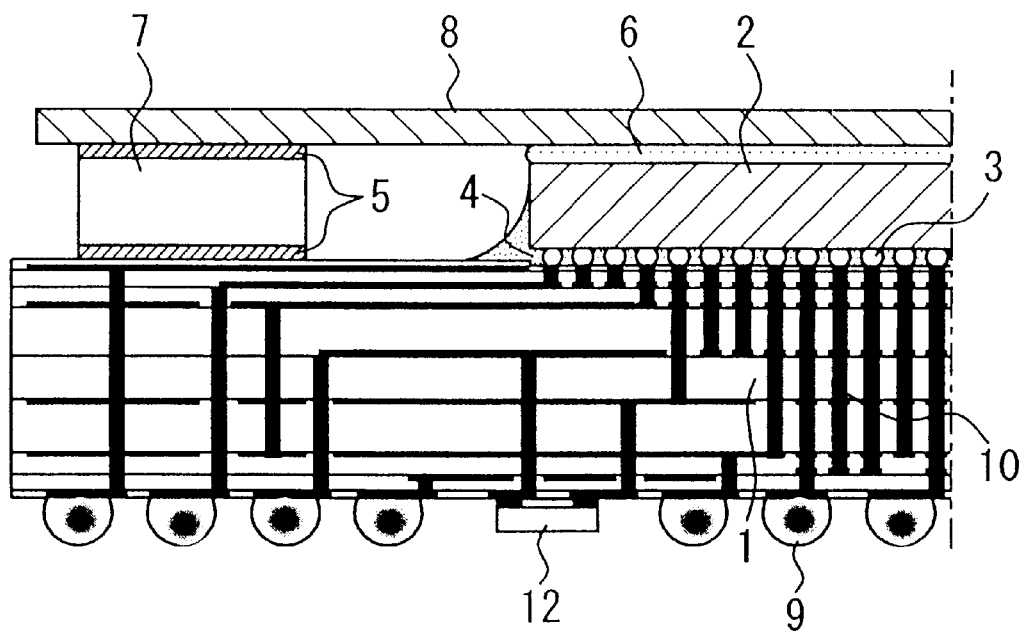
FIG. 4 is a cross-sectional view showing a semiconductor device according to a embodiment 3 of the present invention.

FIG. 4 is a cross-sectional view showing a semiconductor device according to a embodiment 3 of the present invention. In FIG. 4, those elements assigned the same reference numerals as those provided in FIGS. 1 through 3 have the same features, and hence repetition of their explanations is omitted here for brevity. In FIG. 4, reference numeral 12 designates a chip capacitor attached to the undersurface of the BGA substrate 1.

As shown in FIG. 4, the package section 1 of the embodiment 3 has the same structure as that of the semiconductor device of the embodiment 1. In this package section 1, the chip capacitor 12 is attached to a position corresponding to the solder ball 9 located below the edge of the semiconductor chip 2 that is commonly said to have the lowest packaging reliability, thus enabling an improvement in the electrical characteristic of the power/ground planes 13. Even in the case of demand for a package having terminals in the number of 500 or 700 pins to 1000 pins or more, the chip capacitor 12 is attached solely to the area below the edge of the semiconductor chip 2 which has not been used for a signal terminal. Therefore, the packaging reliability imposes substantially no detriment to realization of demand for a large number of pins. In the present embodiment, the distance between the bumps 3 and the semiconductor chip 2 can be made shorter than the distance between the semiconductor chip 2 and the chip capacitor 12 arranged side-by-side in the conventional semiconductor chip. Consequently, the inductance 19 arising in the wiring pattern can be diminished. Even when the chip capacitor 12 equal in capability to that used in the conventional semiconductor device is employed, switching noise can be reduced more effectively.

In the package section 1 of the embodiment 3 having the structure of the embodiment 1, the chip capacitor 12 is attached to a location corresponding to the solder ball 9 positioned below the edge of the semiconductor chip 2 that is commonly said to have the lowest packaging reliability, thus increasing the electrical characteristics of the power/ground plates 13.

Embodiment 4

Figure 5:
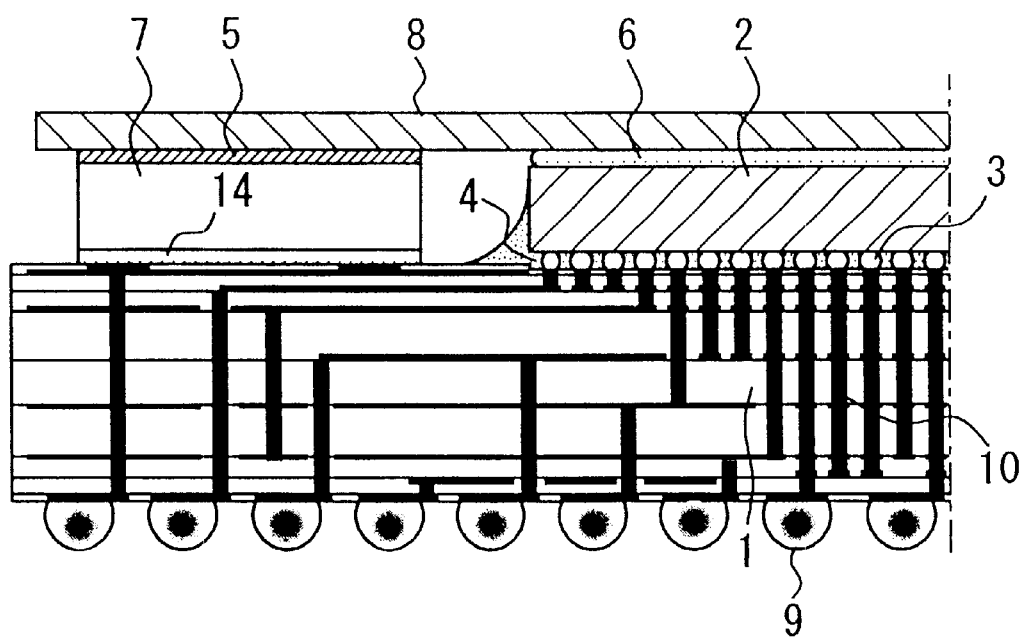
FIG. 5 is a cross-sectional view showing a semiconductor device according to a embodiment 4 of the present invention.

FIG. 5 is a cross-sectional view showing a semiconductor device according to a embodiment 4 of the present invention. In FIG. 5, those elements assigned the same reference numerals as those provided in FIGS. 1 through 4 have the same features, and hence repetition of their explanations is omitted here for brevity. In FIG. 5, reference numeral 14 designates a high-dielectric adhesive applied between the BGA substrate 1 and the ring 7.

As shown in FIG. 5, in the embodiment 4, the high-dielectric adhesive 14 is used as an adhesive to be interposed between the BGA substrate 1 of the embodiment 1 and the ring 7. As a result, the electrical characteristics between the power supply plane 13a and the ground plane 13b can be improved without use of the chip capacitor 12, thus enabling an effective reduction in switching noise.

As mentioned above, in the embodiment 4, the high-dielectric adhesive 14 is used as an adhesive to be applied between the BGA substrate 1, which serves as the upper surface of the package section 1 having the structure of the embodiment 1, and the ring 7. Consequently, the electrical characteristics between the power supply plane 13a and the ground plane 13b can be improved without use of the chip capacitor 12, thus enabling an effective reduction in switching noise.

Embodiment 5

Figure 6:
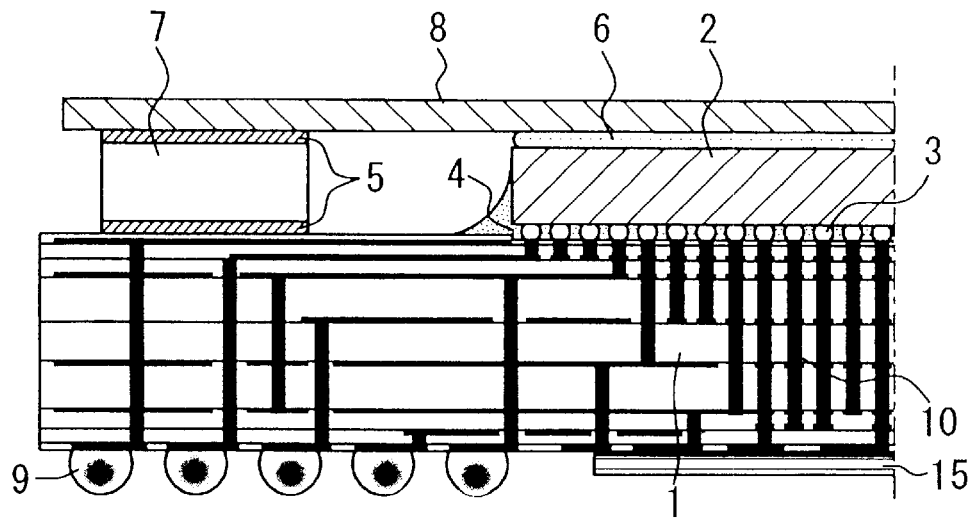
FIG. 6 is a cross-sectional view showing a semiconductor device according to a embodiment 5 of the present invention.

FIG. 6 is a cross-sectional view showing a semiconductor device according to a embodiment 5 of the present invention. In FIG. 6, those elements assigned the same reference numerals as those provided in FIGS. 1 through 5 have the same features, and hence repetition of their explanations is omitted here for brevity. In FIG. 6, reference numeral 15 designates a high-dielectric adhesive applied between the BGA substrate 1 and the ring 7.

As shown in FIG. 6, in the embodiment 5, an adhesive sheet (a high-dielectric adhesive tape) 15 formed from high-dielectric material is caused to adhere to the area of the undersurface (or rear surface) of the package section 1 of the embodiment 1 corresponding to the location of the semiconductor chip 2. Consequently, the electrical characteristics between the power supply plane 13a and the ground plane 13b can be improved without use of the chip capacitor 12, thus enabling an effective reduction in switching noise.

As mentioned above, in the embodiment 5, an adhesive sheet (a high-dielectric adhesive tape) 15 formed from high-dielectric material is caused to adhere to the area of the undersurface (or rear surface) of the package section 1 having the structure of the embodiment 1 corresponding to the location of the semiconductor chip 2. Consequently, the electrical characteristics between the power supply plane 13a and the ground plane 13b can be improved without use of the chip capacitor 12, thus enabling an effective reduction in switching noise.

Embodiment 6

Figure 7:
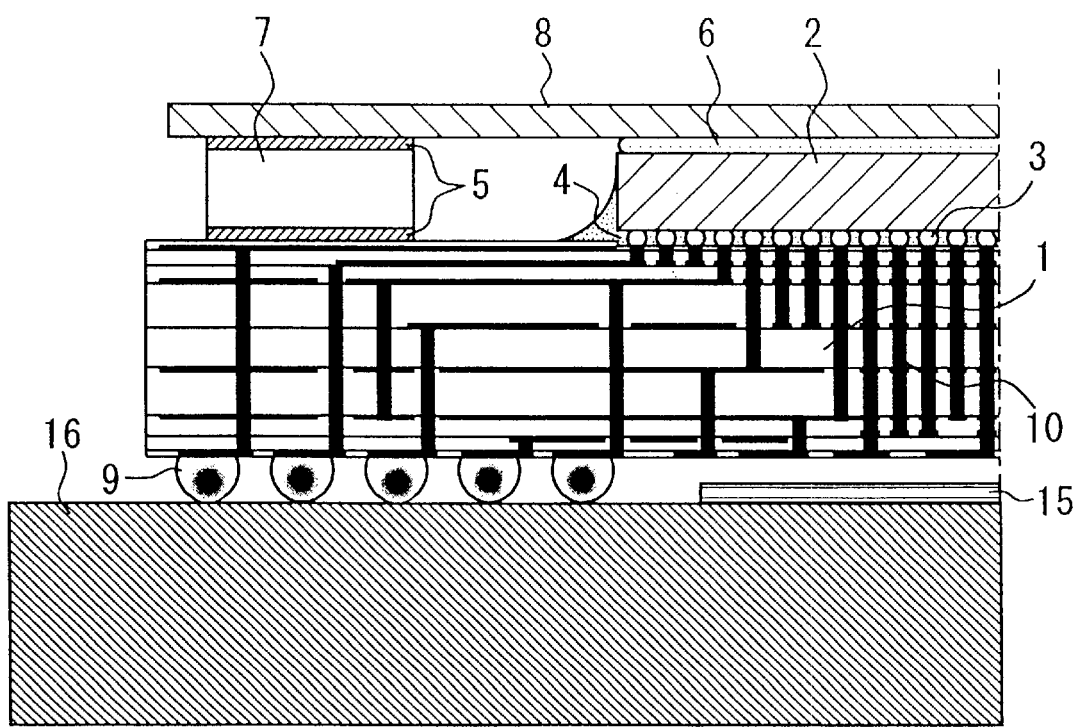
FIG. 7 is a cross-sectional view showing a semiconductor device according to a embodiment 6 of the present invention.
Figure 8:
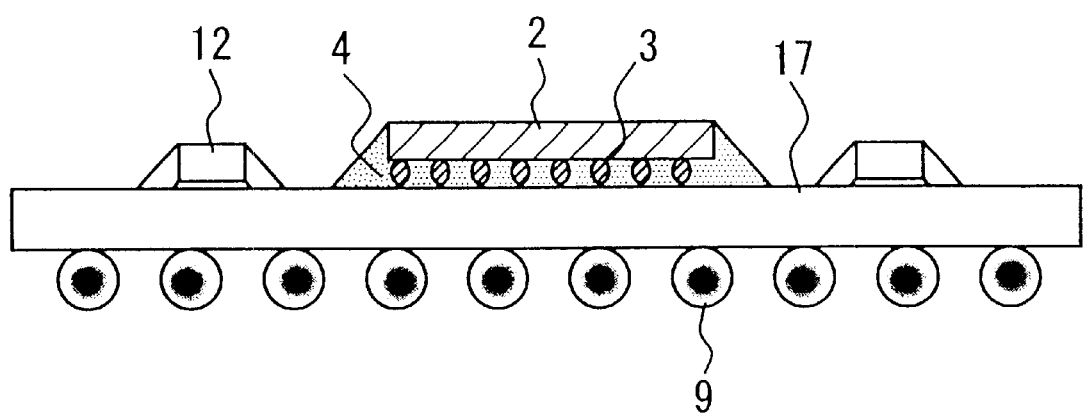
FIG. 8 is a cross-sectional view showing a conventional semiconductor layer.
Figure 9:
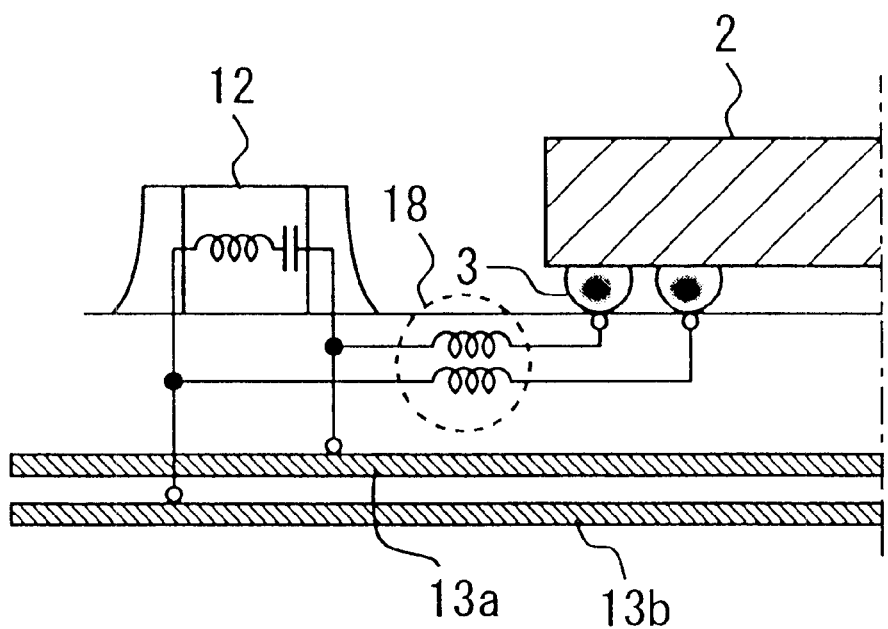
FIG. 9 is an electrical model showing the chip capacitor shown in FIG. 8.

FIG. 7 is a cross-sectional view showing a semiconductor device according to a embodiment 6 of the present invention. In FIG. 6, those elements assigned the same reference numerals as those provided in FIGS. 1 through 6 have the same features, and hence repetition of their explanations is omitted here for brevity. In FIG. 7, reference numeral 16 designates a system board on which the package section 1 is to be mounted.

As shown in FIG. 7, in the embodiment 6, the adhesive sheet (high-dielectric tape) 15 formed from high-dielectric material is placed between the upper surface of the system board 16 on which the package section 1 of the embodiment 1 and the area of the package section 1 where the semiconductor chip 2 is mounted. Consequently, the electrical characteristics between the power supply plane 13a and the ground plane 13b can be improved without use of the chip capacitor 12, thus enabling an effective reduction in switching noise.

As mentioned above, in the embodiment 6, the adhesive sheet (high-dielectric tape) 15 formed from high-dielectric material is placed between the upper surface of the system board 16 on which the package section 1 of the embodiment 1 and the area of the package section 1 where the semiconductor chip 2 is mounted. Consequently, the electrical characteristics between the power supply plane 13a and the ground plane 13b can be improved without use of the chip capacitor 12, thus enabling an effective reduction in switching noise.

As has been described above, the present invention can provide a semiconductor device which ensures high packaging reliability and can be embodied inexpensively even when the device has a large number of terminals, as well as to provide a method of manufacturing the semiconductor device.

Further, the present invention can provide a semiconductor device which maintain high power/ground plane characteristics and can be embodied inexpensively even when the device has a large number of terminals, as well as to provide a method of manufacturing the semiconductor device.

In the semiconductor device, the package section may further comprise a power supply plane and a ground plane; and a high-dielectric layer formed from high-dielectric material between the power supply plane and the ground plane, wherein the bumps of the semiconductor chip are connected to the power supply plane by flip-chip solder bonding, and the bumps different from the bums are connected to the ground plane by flip-chip solder bonding.

Here, the semiconductor device may further comprise a chip capacitor located on the lower surface of the organic substrate forming the lower surface of the package section and at a position below an edge of the semiconductor chip.

Here, the semiconductor device may further comprise a ring mounted on the organic substrate forming the upper surface of the package section; and an adhesive section formed by using high-dielectric material formed between the ring and the organic substrate forming the upper surface of the organic section.

Here, the semiconductor device may further comprise a tape section formed by using high-dielectric material attached on the lower surface of the organic substrate forming the lower surface of the package section.

Here, the semiconductor device may further comprise a system board or printed substrate formed by using organic material mounting the package section, wherein the thermal expansion coefficient of the system board or the printed substrate is equal to the thermal expansion coefficient of the organic material forming the organic substrate.

Here, the semiconductor device may further comprise a tape section formed by using high-dielectric material attached to a region below the semiconductor chip and on the system board.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 11-206576 filed on Jul. 21, 1999 including specification, claims, drawings and summary are incorporated herein by reference in its entirety.

What is claimed is:

1. A semiconductor device comprising:
   organic substrates formed from organic material;
   a package section formed by stacking a plurality of said organic substrates in a stacking direction;
   stacked vias formed by directly joining together connection holes formed in respective said organic substrates stacked in said package section, in the stacking direction of said organic substrates; and
   a semiconductor chip having bumps bonded to an organic substrate forming the upper surface of said package section and formed at a predetermined pitch,
   wherein said stacked vias are formed at the same pitch as that at which the bumps are formed on said semiconductor chip.

2. The semiconductor device according to claim 1, wherein said package section further comprising:
   a power supply plane and a ground plane; and
   a high-dielectric layer formed from high-dielectric material between said power supply plane and said ground plane, wherein
   the bumps of said semiconductor chip are connected to said power supply plane by flip-chip solder bonding, and bumps different from said bumps of said semiconductor chip are connected to said ground plane by flip-chip solder bonding.

3. The semiconductor device according to claim 2, further comprising a system board formed by using organic material mounting said package section, wherein the thermal expansion coefficient of said system board is equal to the thermal expansion coefficient of the organic material forming said organic substrate.

4. The semiconductor device according to claim 3, further comprising a tape section formed by using high-dielectric material attached to a region below said semiconductor chip and on said system board.

5. The semiconductor device according to claim 1, further comprising a chip capacitor located on the lower surface of said organic substrate forming the lower surface of said package section and at a position below an edge of said semiconductor chip.

6. The semiconductor device according to claim 5, further comprising a system board formed by using organic material mounting said package section, wherein the thermal expansion coefficient of said system board is equal to the thermal expansion coefficient of the organic material forming said organic substrate.

7. The semiconductor device according to claim 6, further comprising a tape section formed by using high-dielectric material attached to a region below said semiconductor chip on said system board.

8. The semiconductor device according to claim 1, further comprising
   a ring mounted on said organic substrate forming the upper surface of said package section; and
   an adhesive section formed by using high-dielectric material formed between said ring and said organic substrate forming the upper surface of said organic section.

9. The semiconductor device according to claim 8, further comprising a system board formed by using organic material mounting said package section, wherein the thermal expansion coefficient of said system board is equal to the thermal expansion coefficient of the organic material forming said organic substrate.

10. The semiconductor device according to claim 9, further comprising a tape section formed by using high-dielectric material attached to a region below said semiconductor chip and on system board.

11. The semiconductor device according to claim 1, further comprising a tape section formed by using high-dielectric material attached on the lower surface of said organic substrate forming the lower surface of said package section.

12. The semiconductor device according to claim 11, further comprising a substrate formed by using organic material mounting said package section, wherein the thermal expansion coefficient of said substrate is equal to the thermal expansion coefficient of the organic material forming said organic substrate.

13. The semiconductor device according to claim 12, further comprising a tape section formed by using high-dielectric material attached to a region below said semiconductor chip.

14. The semiconductor device according to claim 1, further comprising a substrate formed by using organic material mounting said package section, wherein the thermal expansion coefficient of said substrate is equal to the thermal expansion coefficient of the organic material forming said organic substrate.

15. The semiconductor device according to claim 14, further comprising a tape section formed by using high-dielectric material attached to a region below said semiconductor chip.

* * * * *